United States Patent
Lee et al.

(10) Patent No.: US 12,218,291 B2
(45) Date of Patent: Feb. 4, 2025

(54) LIGHT-EMITTING DEVICE

(71) Applicant: Samsung Display Co., Ltd., Yongin-si (KR)

(72) Inventors: Seulgee Lee, Yongin-si (KR); Ho Lim, Yongin-si (KR); Taemin Kim, Yongin-si (KR); Bongsung Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 315 days.

(21) Appl. No.: 16/999,718

(22) Filed: Aug. 21, 2020

(65) Prior Publication Data

US 2021/0288230 A1    Sep. 16, 2021

(30) Foreign Application Priority Data

Mar. 3, 2020  (KR) .................. 10-2020-0026791

(51) Int. Cl.
*C09D 7/63* (2018.01)
*C08L 83/04* (2006.01)
(Continued)

(52) U.S. Cl.
CPC .............. *H01L 33/56* (2013.01); *C08L 83/04* (2013.01); *C09D 5/00* (2013.01); *C09D 7/63* (2018.01);
(Continued)

(58) Field of Classification Search
CPC ..... H01L 33/56; H01L 25/0753; H01L 33/62; C08L 83/04; C08L 83/10; C09D 5/00;
(Continued)

(56) References Cited

U.S. PATENT DOCUMENTS

2007/0045619 A1* 3/2007 Park ..................... B82Y 30/00
                                                          257/40
2017/0062400 A1    3/2017 Li et al.
(Continued)

FOREIGN PATENT DOCUMENTS

CN    105144387    12/2015
CN    105470274    4/2016
(Continued)

OTHER PUBLICATIONS

KR20140141500A English machine translation (2014).*
(Continued)

*Primary Examiner* — Michael B Nelson
(74) *Attorney, Agent, or Firm* — KILE PARK REED & HOUTTEMAN PLLC

(57) ABSTRACT

A light-emitting device is provided. The light-emitting device includes a first electrode; a second electrode; a subminiature light-emitting device disposed between the first electrode and the second electrode; and a planarization layer disposed between the first electrode and the second electrode. The planarization layer is prepared by curing a composition including an oligomeric compound that includes a group represented by Formula A, a group represented by Formula B, a group represented by Formula C, or any combination thereof:

<Formula A>

(Continued)

-continued

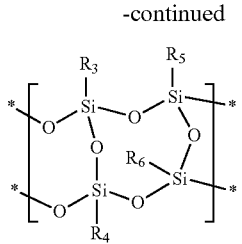

<Formula B>

<Formula C>

Substituents in Formula A, Formula B, and Formula C may be understood as described in connection with the detailed description.

20 Claims, 6 Drawing Sheets

(51) Int. Cl.
| | |
|---|---|
| *C09D 5/00* | (2006.01) |
| *C09D 183/04* | (2006.01) |
| *C09D 183/06* | (2006.01) |
| *H01L 33/56* | (2010.01) |

(52) U.S. Cl.
CPC ......... *C09D 183/04* (2013.01); *C09D 183/06* (2013.01); *Y10T 428/31663* (2015.04)

(58) Field of Classification Search
CPC ...... C09D 7/63; C09D 183/04; C09D 183/06; Y10T 428/31663; C08G 77/12; C08G 77/16; C08G 77/20; C08G 77/24; C08G 77/80; C08G 77/04; C08G 77/44; H10K 85/40; C08K 5/3432; C08K 5/5415
See application file for complete search history.

(56) References Cited

U.S. PATENT DOCUMENTS

| | | | |
|---|---|---|---|
| 2017/0247346 A1* | 8/2017 | Haaf-Kleinhubbert | ..................... C07D 307/12 |
| 2019/0071599 A1 | 3/2019 | Wang et al. | |
| 2020/0013975 A1 | 1/2020 | Bibl et al. | |
| 2020/0216671 A1* | 7/2020 | Matsuzaki | ................. C08J 5/18 |

FOREIGN PATENT DOCUMENTS

| | | | |
|---|---|---|---|
| KR | 10-0470904 | | 3/2005 |
| KR | 10-2007-0044913 | | 5/2007 |
| KR | 10-2014-0141500 | | 12/2014 |
| KR | 10-2015-0102745 | | 9/2015 |
| KR | 10-2015-0105611 | | 9/2015 |
| KR | 2015/0105611 | * | 12/2015 |
| KR | 10-2016-0082287 | | 7/2016 |
| KR | 10-2019-0009215 | | 1/2019 |
| KR | 10-2019-0061227 | | 6/2019 |
| WO | 2009/104643 | | 8/2009 |
| WO | WO-2019098622 A1 | * | 5/2019 ............. C03C 17/32 |

OTHER PUBLICATIONS

KR20160082287A English machine translation (2016).*
English machine translation of WO2019098622A1 (2019).*
Machine translation of KR 2015/0105611, retrieved Sep. 21, 2024.*
Chinese Office Action for Chinese Patent Application or Patent No. 202011176191.9, dated Jun. 29, 2024.

* cited by examiner

LIGHT-EMITTING DEVICE

CROSS-REFERENCE TO RELATED APPLICATION(S)

This application claims priority to and benefits of Korean Patent Application No. 10-2020-0026791 under 35 U.S.C. § 119, filed on Mar. 3, 2020 in the Korean Intellectual Property Office, the entire contents of which are incorporated herein by reference.

BACKGROUND

1. Technical Field

Embodiments relate to a light-emitting device.

2. Description of the Related Art

A light-emitting device (LED) has high light conversion efficiency and very low energy consumption, and is semi-permanent and environmentally friendly. In order to utilize an LED in lighting or a display device, it is necessary to connect the LED between a pair of electrodes capable of applying power to the LED.

To affix LEDs on a pair of electrodes, an over-coating material is used for planarization.

Thus, a planarization material that is suitable and stable for driving conditions of the LED is demanded.

SUMMARY

Embodiments provide a light-emitting device including a planarization layer having high light resistance, high heat resistance, and high degree of planarization.

Aspects will be set forth in part in the description which follows and, in part, will be apparent from the description, or may be learned by practice of the embodiments of the disclosure.

According to embodiments, a light-emitting device includes
a first electrode,
a second electrode facing the first electrode, and
a light-emitting device disposed between the first electrode and the second electrode, and a planarization layer disposed between the first electrode and the second electrode,
wherein the subminiature light-emitting device may be a nano-LED having a nano unit size or a micro-LED having a micro unit size, and the planarization layer may comprise a composition including an oligomeric compound that may include a group represented by Formula A, a group represented by Formula B, a group represented by Formula C or a combination thereof:

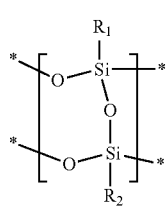

<Formula A>

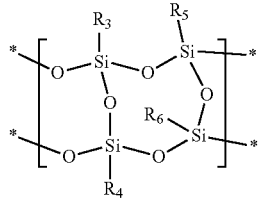

<Formula B>

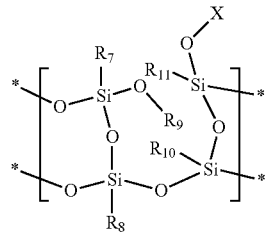

<Formula C>

In Formulae A to C, X may be $R_{12}$ or $[(SiO_{3/2}R)_{4+2n}O]$, R and $R_1$ to $R_{12}$ may each independently be hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, n may be an integer from 1 to 20, and

* indicates a binding site to a neighboring atom.

In an embodiment, the composition may further include a siloxane resin.

In an embodiment, the composition may further include a cross-linked resin.

In an embodiment, the composition may further include a silane coupling agent.

In an embodiment, the composition may further include polymethylvinyl siloxane, poly(methylphenyl)siloxane, poly(phenylvinyl)-co-(methylvinyl)silsesquioxane, PDV-1635, PMV-9925, PVV-3522, or any combination thereof.

In an embodiment, the composition may further include a silsesquioxane copolymer, phenylhydrosilsesquioxane, dimethylsilylphenylether, or any combination thereof.

In an embodiment, the composition may further include a sulfide-based silane compound, a mercapto-based silane compound, a vinyl-based silane compound, an amino-based silane compound, a glycidoxy-based silane compound, a nitro-based silane compound, a chloro-based silane compound, a methacryl-based silane compound, or any combination thereof.

In embodiments, the composition may further include a siloxane resin, a cross-linked resin, and a silane coupling agent. Based on the total composition, the composition may include an amount of the oligomeric compound in a range of about 1 weight % to about 20 weight %, an amount of the siloxane resin in a range of about 30 weight % to about 85 weight %, an amount of the cross-linked resin in a range of about 5 weight % to about 50 weight %, and an amount of the silane coupling agent in a range of about 0.05 weight % to about 10 weight %.

In an embodiment, the subminiature light-emitting device may have a size in a range of about 0.1 μm to about 10 μm.

In an embodiment, the planarization layer may be prepared by curing the composition, and a curing temperature of the composition may be in a range of about 150° C. to about 200° C.

In an embodiment, the composition may not include a solvent.

In an embodiment, the composition may further include a radical scavenger.

BRIEF DESCRIPTION OF THE DRAWINGS

The above and other aspects, features, and advantages of embodiments of the disclosure will be more apparent from the description taken in conjunction with the accompanying drawings, in which.

DETAILED DESCRIPTION OF THE EMBODIMENTS

Figure 1:
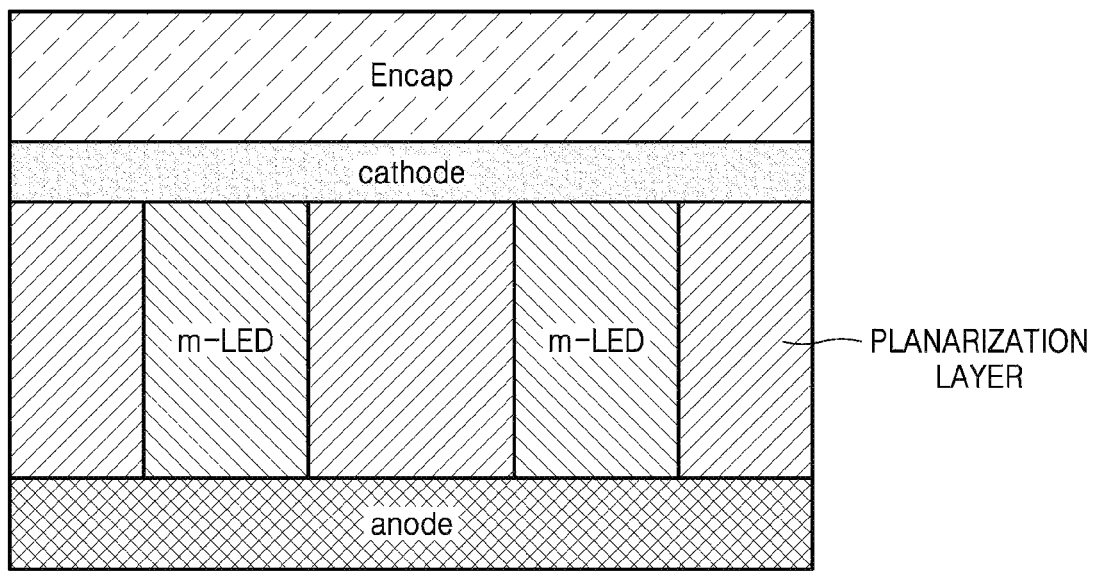
FIG. 1 is a schematic diagram showing a structure of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, or C" may indicate only A, only B, only C, both A and B, both A and C, both B and C, all of A, B, and C, or variations thereof.

Hereinafter, embodiments will be described in detail with reference to the accompanying drawings. The same or corresponding components will be denoted by the same reference numerals, and thus redundant description thereof will be omitted.

As used herein, the singular forms "a," "an" and "the" are intended to include the plural forms as well, unless the context clearly indicates otherwise.

It will be further understood that the terms "comprises," "comprising," "includes," "including," "contains," and/or "containing" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Sizes of elements in the drawings may be exaggerated for convenience of explanation. In other words, since sizes and thicknesses of components in the drawings are arbitrarily illustrated for convenience of explanation, the following embodiments of the disclosure are not limited thereto.

According to an aspect of the disclosure, a light-emitting device may include: a first electrode; a second electrode facing the first electrode; a subminiature light-emitting device disposed between the first electrode and the second electrode; and a planarization layer disposed between the first electrode and the second electrode, wherein the planarization layer is prepared by curing a composition including an oligomeric compound that includes a group represented by Formula A, a group represented by Formula B, a group represented by Formula C, or any combination thereof.

In an embodiment, the first electrode may be an anode, and the second electrode may be a cathode. Between the first electrode and the second electrode, the subminiature light-emitting device may be disposed.

FIG. 1 is a schematic diagram showing a structure of the light-emitting device according to an embodiment.

Referring to FIG. 1, the light-emitting device according to an embodiment may include micro-LEDs between the anode and the cathode.

The micro-LEDs may be, for example, aligned on the anode in a way of One Transfer. Before the cathode is formed, after the micro-LEDS are aligned in a way of One Transfer, an over-coating process for planarization may be required.

The planarization layer formed by the over-coating process may serve not only to planarize the micro-LEDs, but also to affix the micro-LEDs.

The planarization layer may require preparation by a low-temperature process in order not to damage the micro-LEDs. In order to affix the micro-LEDs by maintaining the alignment and to enable a cathode formation process, the planarization layer may be required to have a high retention rate and a high degree of planarization.

A material for forming the planarization layer needs to have high light resistance and high heat resistance that are stable to high intensity of light (e.g., blue light) and heat, respectively.

[Planarization Layer]

In an embodiment, the planarization layer may be formed by curing the composition including the oligomeric compound that includes a group represented by Formula A, a group represented by Formula B, a group represented by Formula C, or any combination thereof:

<Formula A>

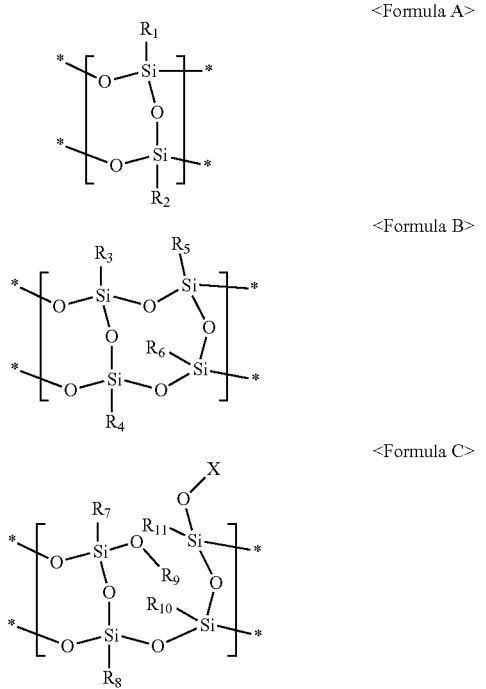

<Formula B>

<Formula C>

In Formulae A to C, X may be $R_{12}$ or $[(SiO_{3/2}R)_{4+2n}O]$, R and $R_1$ to $R_{12}$ may each independently be hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, n may be an integer from 1 to 20, and

* indicates a binding site to a neighboring atom.

In an embodiment, a $C_1$-$C_{60}$ alkyl group, a $C_2$-$C_{60}$ alkenyl group, a $C_1$-$C_{60}$ alkoxy group, a $C_3$-$C_{10}$ cycloalkyl group, a $C_1$-$C_{10}$ heterocycloalkyl group, a $C_6$-$C_{60}$ aryl group, a $C_1$-$C_{60}$ heteroaryl group, a $C_7$-$C_{12}$ aralkyl group, a $C_6$-$C_{60}$ aryloxy group, and a $C_6$-$C_{60}$ arylthio group may each independently be substituted with deuterium, halogen, amine, an epoxy group, a cyclohexylepoxy group, an acryl group, a methacryl group, a thiol group, an isocyanate group, a nitrile group, a nitro group, or a phenyl group.

In an embodiment, n may be 4 or 5 on average.

In an embodiment, the oligomeric compound may include at least two groups represented by Formulae A to C.

In an embodiment, the oligomeric compound may be represented by Formula 1 below:

<Formula 1>

In Formula 1, A may be a group represented by Formula A, C may be a group represented by Formula C, $R_{21}$ to $R_{24}$ may each independently be the same as defined in connection with $R_1$, a may be an integer from 3 to 1,000, and c may be an integer from 1 to 500.

In an embodiment, the oligomeric compound may be represented by Formula 2 below:

<Formula 2>

In Formula 2, A may be a group represented by Formula A, C may be a group represented by Formula C, $R_{25}$ to $R_{28}$ may each independently be the same as defined in connection with $R_1$, a may be an integer from 3 to 1,000, and c and c' may each independently be an integer from 1 to 500.

In an embodiment, the oligomeric compound may be represented by Formula 3 below:

<Formula 3>

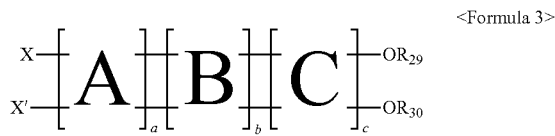

In Formula 3, A may be a group represented by Formula A, B may be a group represented by Formula B, C may be a group represented by Formula C, $R_{29}$ and $R_{30}$ may each independently be the same as defined in connection with $R_1$, X' may independently be the same as defined in connection with X, a may be an integer from 3 to 1,000, b may be an integer from 1 to 500, and c may be an integer from 1 to 500. X and X' may be identical to or different from each other.

In an embodiment, the oligomeric compound may be represented by Formula 4 below:

<Formula 4>

In Formula 4, A may be a group represented by Formula A, B may be a group represented by Formula B, C may be a group represented by Formula C, $R_{31}$ to $R_{34}$ may each independently be the same as defined in connection with $R_1$, a may be an integer from 3 to 1,000, b may be an integer from 1 to 500, and c and c' may each independently be an integer from 1 to 500.

In an embodiment, the oligomeric compound may be represented by Formula 5 below:

<Formula 5>

In Formula 5, A may be a group represented by Formula A, B may be a group represented by Formula B, C may be a group represented by Formula C, $R_{35}$ to $R_{38}$ may each independently be the same as defined in connection with $R_1$, a and a' may each independently be an integer from 3 to 1,000, b may be an integer from 1 to 500, and c may be an integer from 1 to 500.

In an embodiment, the oligomeric compound may be represented by Formula 6 below:

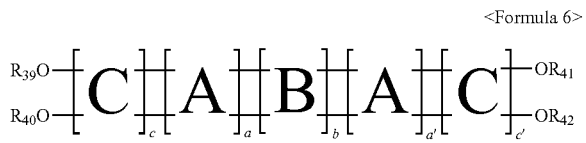

<Formula 6>

In Formula 6, A may be a group represented by Formula A, B may be a group represented by Formula B, C may be a group represented by Formula C, $R_{39}$ to $R_{42}$ may each independently be the same as defined in connection with $R_1$, a and a' may each independently be an integer from 3 to 1,000, b may be an integer from 1 to 500, and c and c' may each independently be an integer from 1 to 500.

In an embodiment, the oligomeric compound may be represented by Formula 7 below:

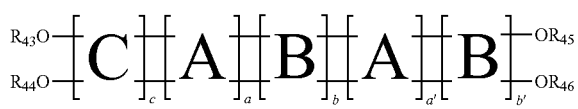

<Formula 7>

In Formula 7, A may be a group represented by Formula A, B may be a group represented by Formula B, C may be a group represented by Formula C, $R_{43}$ to $R_{46}$ may each independently be the same as defined in connection with $R_1$, a and a' may each independently be an integer from 3 to 1,000, b and b' may each independently be an integer from 1 to 500, and c may be an integer from 1 to 500.

In an embodiment, the oligomeric compound may have a weight average molecular weight in a range of about 1,000 to about 1,000,000. For example, the oligomeric compound may have a weight average molecular weight in a range of about 5,000 to about 100,000. For example, the oligomeric compound may have a weight average molecular weight in a range of about 7,000 to about 50,000. When the oligomeric compound has the weight average molecular weight within the ranges above, the processability and physical properties of the oligomeric compound may be improved at the same time.

Considering that a synthetic product of cage-type polyhedral oligomeric silsesquioxane (POSS) is in powder form and used in the composition, POSS has poor compatibility with a siloxane resin which is used as a main resin. Thus, POSS is not suitable for the preparation of the composition, and in order to increase the compatibility with the siloxane resin, a dissolution process in a solvent is necessary.

However, in case that a solvent evaporates through vacuum and curing processes, a very low degree of planarization may result, so that a subsequent electrode formation process (e.g., a cathode formation process) may not be smoothly performed. Although the cathode is formed, the efficiency of the completed light-emitting device including the cathode may drop rapidly.

Considering that the oligomeric compound according to an embodiment is not a complete cage-type compound, the compatibility with the siloxane resin may be increased, so that a solvent-free process may be performed, and the planarization layer may be obtained through a condensation reaction.

Therefore, in case that there is no solvent to be evaporated, only volatile by-products formed by a condensation reaction and having a small molecular weight may be removed, and accordingly, the formed planarization layer may have a high degree of planarization.

In an embodiment, in addition to the oligomeric compound, the composition may further include a siloxane resin, a cross-linked resin, a silane coupling agent, and the like. The composition may further include a catalyst or a reaction retardant.

In an embodiment, the siloxane resin may include polymethylvinyl siloxane, poly(methylphenyl)siloxane, poly(phenylvinyl)-co-(methylvinyl)silsesquioxane, PDV-1635 (by Gelest Company), PMV-9925 (by Gelest Company), PVV-3522 (by Gelest Company), or any combination thereof.

In an embodiment, the cross-linked resin may include a silsesquioxane copolymer, phenylhydrosilsesquioxane, dimethylsilylphenylether, or any combination thereof.

In an embodiment, the coupling agent may include a sulfide-based silane compound, a mercapto-based silane compound, a vinyl-based silane compound, an amino-based silane compound, a glycidoxy-based silane compound, a nitro-based silane compound, a chloro-based silane compound, a methacryl-based silane compound, or any combination thereof.

In an embodiment, the sulfide-based silane compound may be selected from bis(3-triethoxysilylpropyl)tetrasulfide, bis(2-triethoxysilylethyl)tetrasulfide, bis(4-triethoxysilylbutyl)tetrasulfide, bis(3-trimethoxysilylpropyl)tetrasulfide, bis(2-trimethoxysilylethyl)tetrasulfide, bis(4-trimethoxysilylbutyl)tetrasulfide, bis(3-triethoxysilylpropyl)trisulfide, bis(2-triethoxysilylethyl)trisulfide, bis(4-triethoxysilylbutyl)trisulfide, bis(3-trimethoxysilylpropyl)trisulfide, bis(2-trimethoxysilylethyl)trisulfide, bis(4-trimethoxysilylbutyl)trisulfide, bis(3-triethoxysilylpropyl)disulfide, bis(2-triethoxysilylethyl)disulfide, bis(4-triethoxysilylbutyl)disulfide, bis(3-trimethoxysilylpropyl)disulfide, bis(2-trimethoxysilylethyl)disulfide, bis(4-trimethoxysilylbutyl)disulfide, 3-trimethoxysilylpropyl-N,N-dimethylthiocarbamoyltetrasulfide, 3-triethoxysilylpropyl-N,N-dimethylthiocarbamoyltetrasulfide, 2-triethoxysilylethyl-N,N-dimethylthiocarbamoyltetrasulfide, 2-trimethoxysilylethyl-N,N-dimethylthiocarbamoyltetrasulfide, 3-trimethoxysilylpropylbenzothiazoletetrasulfide, 3-triethoxysilylpropylbenzothiazoletetrasulfide, 3-trimethoxysilylpropylmethacrylatemonosulfide, 3-trimethoxysilylpropylmethacrylatemonosulfide, or any mixture thereof.

In an embodiment, the mercapto-based compound may be selected from 3-mercaptomercaptopropyltrimethoxysilane, 3-mercaptopropyltriethoxysilane, 2-mercaptoethyltrimethoxysilane, 2-mercaptoethyltriethoxysilane, or any mixture thereof.

In an embodiment, the vinyl-based silane compound may be selected from ethoxysilane, vinyltrimethoxysilane, or any mixture thereof.

In an embodiment, the amino-based silane compound may be selected from 3-aminopropyltriethoxysilane, 3-aminopropyltrimethoxysilane, 3-(2-aminoethyl)aminopropyltriethoxysilane, 3-(2-aminoethyl)aminopropyltrimethoxysilane, or any mixture thereof.

In an embodiment, the glycidoxy-based silane compound may be selected from γ-glydoxypropyltriethoxysilane, γ-glydoxypropyltrimethoxysilane, γ-glydoxypropylmethyldiethoxysilane, γ-glydoxypropylmethyldimethoxysilane, or any mixture thereof.

In an embodiment, the nitro-based silane compound may be selected from 3-nitro grouppropyltrimethoxysilane, 3-nitro grouppropyltriethoxysilane, or any mixture thereof.

In an embodiment, the chloro-based silane compound may be selected from 3-chloropropyltrimethoxysilane, 3-chloropropyltriethoxysilane, 2-chloroethyltrimethoxysilane, 2-chloroethyltriethoxysilane, or any mixture thereof.

In an embodiment, the methacryl-based silane compound may be selected from cyclosiloxane, γ-methacryloxypropyl trimethoxysilane, γ-methacryloxypropyl methyldimethoxysilane, γ-methacryloxypropyl dimethylmethoxysilane, or any mixture thereof.

In an embodiment, the composition may further include a siloxane resin, a cross-linked resin, and a silane coupling agent. Based on the total composition, the composition may include an amount of the oligomeric compound in a range of about 1 weight % to about 20 weight %, an amount of the siloxane resin in a range of about 30 weight % to about 85 weight %, an amount of the cross-linked resin in in a range of about 5 weight % to about 50 weight %, and an amount of the silane coupling agent in a range of about 0.05 weight % to about 10 weight %. When the amounts of the oligomeric compound, the siloxane resin, the cross-linked resin, and the silane coupling agent are within the ranges above, a planarization layer formation process may be easily performed, and the planarization layer thus prepared may have excellent properties.

In an embodiment, the planarization layer may be prepared by curing the composition. The curing temperature may be in a range of about 150° C. to about 200° C. For example, the curing temperature may be in a range of about 170° C. to about 190° C.

The curing temperature within the ranges above does not cause any damage to the subminiature light-emitting device.

In an embodiment, the composition forming the planarization layer may not substantially include a solvent.

In an embodiment, the composition may further include a radical scavenger. The radical scavenger may be, for example, a ring-type secondary amine compound.

In an embodiment, the composition may not include the radical scavenger.

In an embodiment, the radical scavenger may be Compound 300 below:

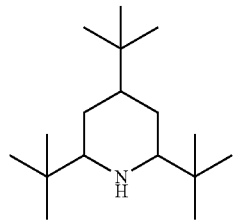

In an embodiment, an amount of the radical scavenger may be in a range of about 2,000 ppm to about 3,000 ppm.

[Subminiature Light-Emitting Device]

The subminiature light-emitting device may be a nano-LED having a nano unit size or a micro-LED having a micro unit size.

The subminiature light-emitting device may include a first semiconductor layer, a second semiconductor layer, and an active layer disposed between the first semiconductor layer and the second semiconductor layer.

The first semiconductor layer, the active layer, and the second semiconductor layer may be sequentially stacked in the longitudinal direction of the subminiature light-emitting device.

For example, the first semiconductor layer may include an n-type semiconductor layer, and the second semiconductor layer may include a p-type semiconductor layer. Such semiconductor layers may include a semiconductor material having a composition formula of $In_xAl_yGa_{1-x-y}N$ (where $0 \leq x \leq 1$, $0 \leq y \leq 1$, and $0 \leq x+y \leq 1$), such as GaN, AlN, AlGaN, InGaN, InN, InAlGaN, AlInN, and the like.

The first semiconductor layer may be doped with an n-type dopant, such as Si, Ge, Sn, and the like, and the second semiconductor layer may be doped with a p-type dopant, such as Mg, Zn, Ca, Sr, Ba, and the like.

For example, the first semiconductor layer may include a p-type semiconductor layer, and the second semiconductor layer may include an n-type semiconductor layer.

The active layer may be disposed between the first semiconductor layer and the second semiconductor layer, and for example, may be formed in a single quantum well structure or a multiple quantum well structure. The active layer is a region where electrons and holes recombine, and as electrons and holes recombine, the active layer transitions to a low energy level, thereby generating light having a wavelength corresponding thereto. When the active layer is included in a typical LED used for lighting, display, or the like, the active layer may be used without limitation. The active layer may be variously positioned according to the type of the light-emitting device.

The embodiments are not limited to the above-described embodiments, and in an embodiment, the subminiature light-emitting device may further include a separate fluorescence layer, a separate active layer, a separate semiconductor layer, and/or a separate electrode layer, on an upper portion or a lower portion of the first semiconductor layer and the semiconductor layer. Light generated from the active layer may be emitted to the outer surface and/or both side surfaces of the subminiature light-emitting device.

In embodiments, the subminiature light-emitting device may further include a first electrode layer disposed under the first semiconductor layer and a second electrode layer disposed on the second semiconductor layer.

The first electrode layer and the second electrode layer may each serve as an ohmic contact electrode. However, the first electrode layer and the second electrode layer are not limited thereto, and may each serve as a Shottky contact electrode. The first electrode layer and the second electrode layer may include, for example, one or more metals selected from aluminum, titanium, indium, gold, and silver. Materials included in the first electrode layer and the second electrode layer may be identical to or different from each other.

The subminiature light-emitting device may further include an insulating film surrounding the outer surface thereof. As the insulating film protects the outer surface of the light-emitting device including the outer surface of the active layer, a reduction in luminescence efficiency may be prevented. The insulating film may cover the entire outer surface of the light-emitting device, or may cover only a part of the outer surface of the light-emitting device.

The subminiature light-emitting device may have various shapes, such as a cylinder, a cube, and the like. For example, the subminiature light-emitting device may have a cylindrical shape.

For example, the subminiature light-emitting device may have a diameter in a range of about 0.1 μm to about 1 μm and a length in a range of about 0.1 μm to about 10 μm, but embodiments are not limited thereto.

The subminiature light-emitting device may emit red light, green light, or blue light.

Definitions of Substituents

In the following definition of substituents, the carbon number range is only exemplary.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by -O$A_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms.

The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —O$A_{102}$ (wherein $A_{102}$ is the $C_6$-$C_{60}$ aryl group), and the term "$C_6$-$C_{60}$ arylthio group" as used herein refers to —S$A_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

The term "$C_7$-$C_{12}$ aralkyl group" as used herein refers to a group having an aryl part and an alkyl part, and aryl of the aryl part and alkyl of the alkyl part are the same as described above. Non-limiting examples of the aralkyl group include a benzyl group, a phenethyl group, and a phenylpropyl group.

In the specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, and the substituted $C_7$-$C_{12}$ aralkyl group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *', and *", as used herein, unless defined otherwise, each refer to a binding site to a neighboring atom in a corresponding formula.

The following Examples are intended to specifically illustrate or describe the disclosure, and thus do not limit the scope of the disclosure.

EXAMPLES

Preparation of Oligomeric Compound

Compound 30 of the following structure including Unit 10 [corresponding to Formula A] and Unit 20 [corresponding to Formula C] was prepared:

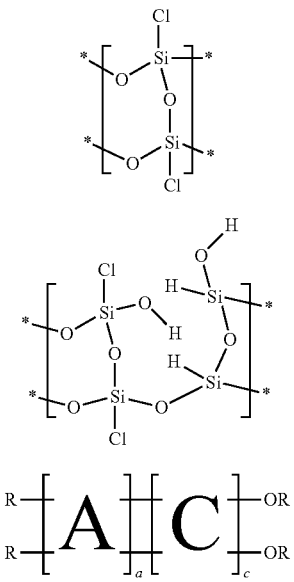

In Compound 30, R is an epoxy group, a is an integer from 700 to 900, and c is an integer from 30 to 200.

2. Preparation of Composition for Forming Planarization Layer

A composition for forming a planarization layer was prepared at a mixture ratio shown in Table 1 below.

TABLE 1

|  | Example 1 | Example 2 | Example 3 |
|---|---|---|---|
| Siloxane resin 1 | 54 wt % | 54 wt % | 54 wt % |
| Siloxane resin 2 | 22 wt % | 27 wt % | 22 wt % |
| Siloxane resin 3 | — | — | 2 wt % |
| Cross-linked resin 1 | 3 wt % | 5 wt % | 8 wt % |
| Cross-linked resin 2 | 17 wt % | 11 wt % | 9 wt % |
| Oligomeric compound | 3 wt % | 2 wt % | 4 wt % |

TABLE 1-continued

|  | Example 1 | Example 2 | Example 3 |
|---|---|---|---|
| Silane coupling agent | 0.998 wt % | 0.998 wt % | 0.997 wt % |
| Radical scavenger | 2,000 ppm | 2,000 ppm | 3,000 ppm |

Siloxane resin 1: Poly(methylphenyl)siloxane
Siloxane resin 2: Poly(phenylvinyl)-co-(methylvinyl)silsesquioxane
Siloxane resin 3: PDV-1635 (by Gelest Company)
Cross-linked resin 1: Phenylhydrosilsesquioxane
Cross-linked resin 2: Dimethylsilylphenylether
Oligomeric compound: Compound 30
Silane coupling agent: Methacrylate-based cyclosiloxane
Radical scavenger:

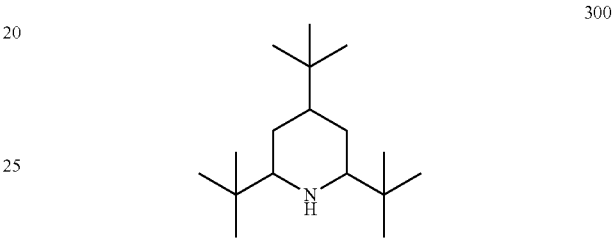

Measurement of Retention Rate

A wafer was coated with the composition of Example 1, subjected to a vacuum process, and cured, thereby completing the preparation of a planarization layer.

Weighing was performed for every process, and the difference between processes was calculated to obtain retention rate values.

Here, the coating process was performed at 1,500 rpm/20 s and 2,000 rpm/20 s conditions, the vacuum process was performed at −0.1 MPa for 3 minutes, and the curing process was performed at 180° C. for 20 minutes.

Figure 2:
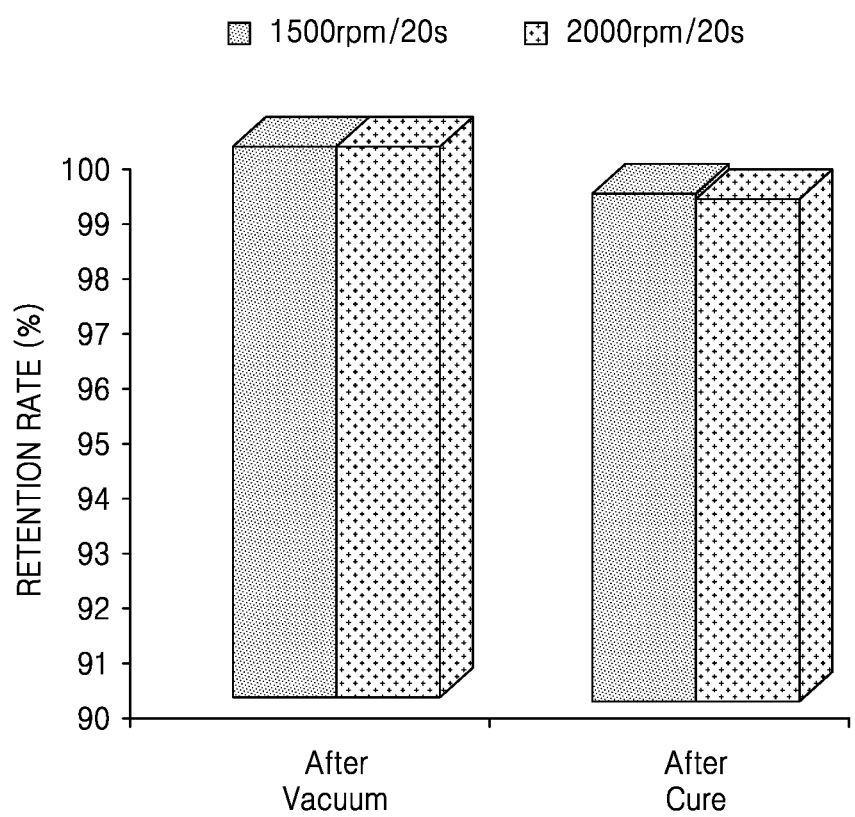
FIG. 2 is a graph showing retention rates after a vacuum process and after a curing process, each following a coating process performed on a composition according to an embodiment.

The retention rates after the vacuum process and the curing process are shown in FIG. 2.

Referring to FIG. 2, it was confirmed that the retention rates were more than 99% in both 1,500 rpm/20 s and 2,000 rpm/20 s coating conditions.

4. Measurement of Degree of Planarization (DOP)

Measurement Method

Figure 3:
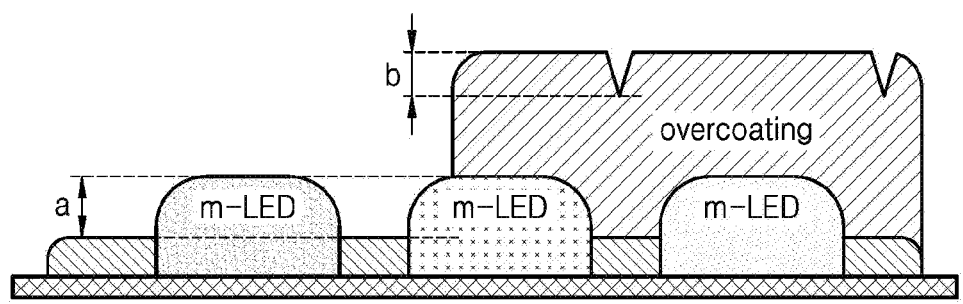
FIG. 3 is a schematic diagram showing a method of measuring a degree of planarization.

FIG. 3 is a diagram schematically showing a method of measuring a DOP.

A substrate on which micro-LEDs were positioned was coated with the composition of Example 2, and b was measured.

The composition may go down as much as b, but the larger b value refers to less planarization. In this regard, the b value of 0 refers to 100% planarization.

Figure 4:
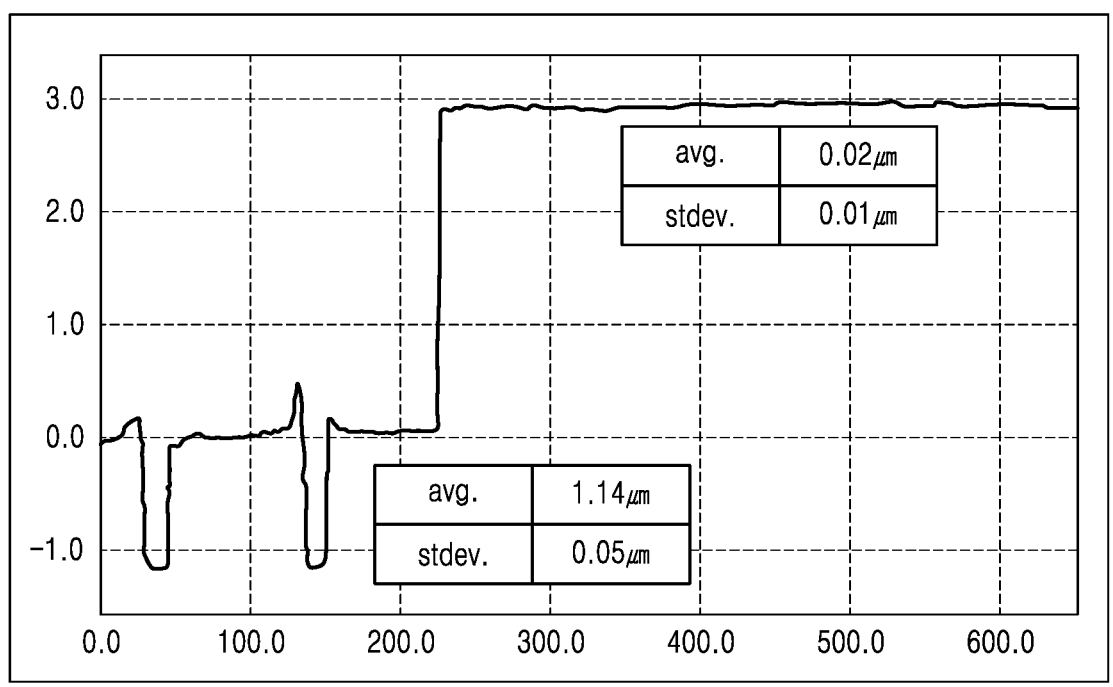
FIG. 4 is a graph showing a and b values and a profile for the case where a composition according to an embodiment is coated to a thickness of 3 μm.

The DOP value was calculated according to the following equation:

$$DOP=(a-b)/a*100$$

Where the substrate on which micro-LEDs are positioned was coated with the composition of Example 2 to a thickness of 3 μm, the measured a and b values and the profiles are shown in FIG. 4.

Referring to FIG. 4, the a value was 1.14 μm, and the b value was 0.02 μm, resulting in 97.6% of the DOP.

Figure 5:
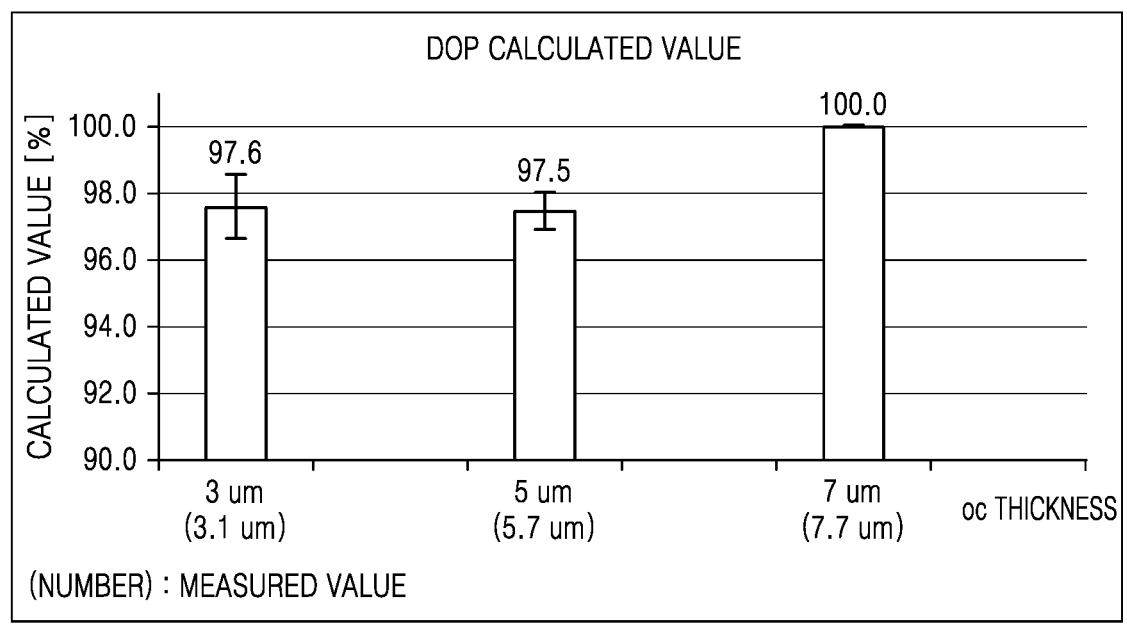
FIG. 5 is a graph showing a degree of planarization calculated based on measured values for the case where a composition according to an embodiment is coated to a thickness of 3 μm, 5 μm, and 7 μm, respectively.

The DOP values calculated based on the measured values for the case where the composition of Example 2 was coated to a thickness of 3 μm, 5 μm, and 7 μm, respectively, are shown in FIG. 5.

Referring to FIG. 5, it was confirmed that all the cases showed high DOP.

5. Preparation of Subminiature Light-Emitting Device

A subminiature light-emitting device was prepared by growing and separating LEDs according to a chemical vapor deposition (CVD) method.

6. Evaluation of High Light Resistance and High Heat Resistance

After a first electrode was formed on the substrate, the subminiature light-emitting device was aligned in a way of One Transfer. The composition of Example 3 was overcoated thereon to a thickness of 10 μm.

After standing at −0.1 MPa for 3 minutes, the resulting substrate was cured at 180° C. for 20 minutes.

A second electrode was formed thereon, so as to form a capping layer.

Evaluation Method

Regarding the light-emitting device thus prepared (3,000 nit, 60° C.), changes in the light characteristics observed for 1,000 hours (transmissivity, Yellow Index) were recorded, and the results are shown in Table 2 below.

TABLE 2

|  | Δx | Δy | ΔLv |
| --- | --- | --- | --- |
| 24 hr | 0.004 | 0.005 | 99.97% |
| 192 hr | 0.004 | 0.006 | 101.05% |
| 528 hr | 0.004 | 0.006 | 101.65% |
| 864 hr | 0.004 | 0.005 | 101.29% |
| 1000 hr | 0.004 | 0.005 | 101.29% |

Figure 6:
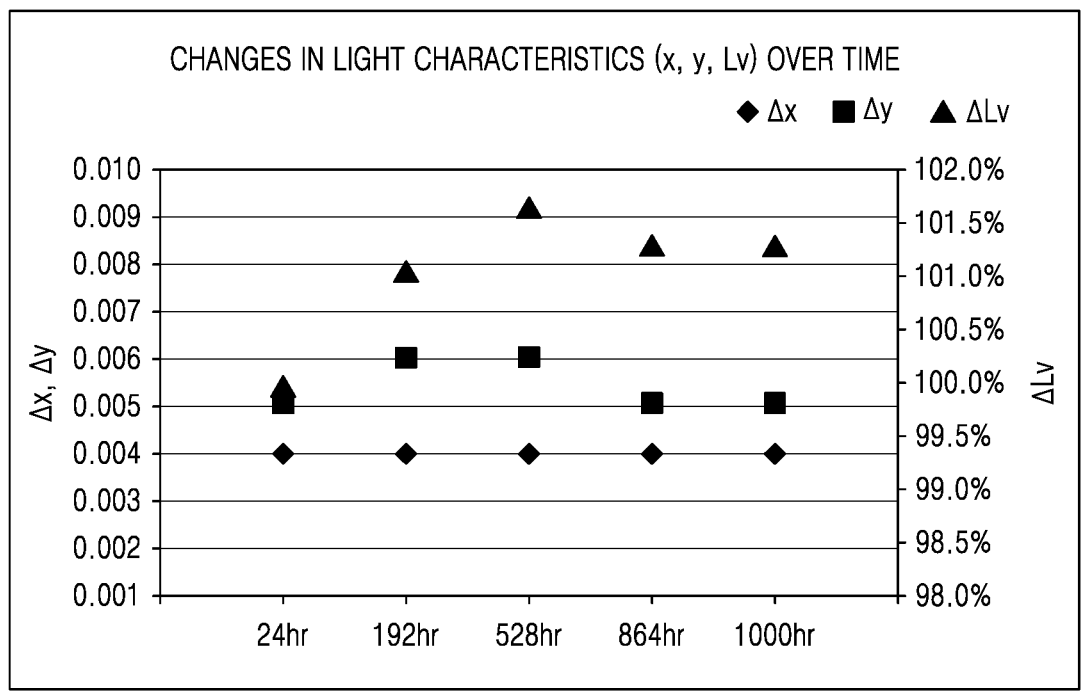
FIG. 6 is a graph showing changes in light characteristics (transmissivity, Yellow Index) of a light-emitting device (3,000 nit, 60° C.) according to an embodiment observed for 1,000 hours.

The results are also shown in a graph of FIG. 6.

Referring to FIG. 6, it was confirmed that the changes in color coordinates and luminance were insignificant until 1,000 hours.

According to the one or more embodiments, a light-emitting device includes a planarization layer having high light resistance, high heat resistance, and high degree of planarization, thereby showing excellent results.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first electrode;
a second electrode facing the first electrode;
a subminiature light-emitting device disposed between the first electrode and the second electrode; and
a planarization layer disposed between the first electrode and the second electrode, wherein the subminiature light-emitting device has a length in a range of about 0.1 μm to about 10 μm, and the planarization layer comprises a composition including an oligomeric compound that is represented by one of Formula 3 to Formula 7:

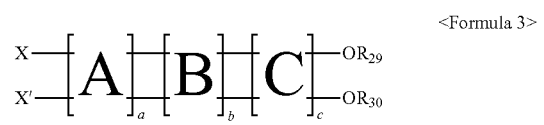

<Formula 3>

<Formula 4>

<Formula 5>

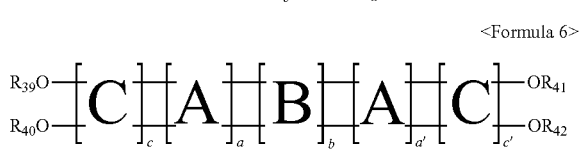

<Formula 6>

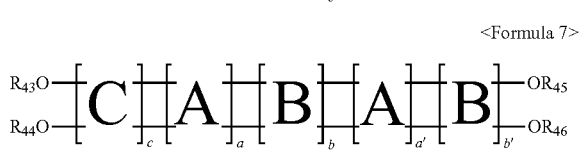

<Formula 7> wherein in Formulae 3 to 7,

A is a group represented by Formula A,

B is a group represented by Formula B,

C is a group represented by Formula C, a and a' are each independently an integer from 3 to 1,000, b and b' are each independently an integer from 1 to 500, and c and c' are each independently an integer from 1 to 500,

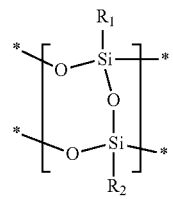

<Formula A>

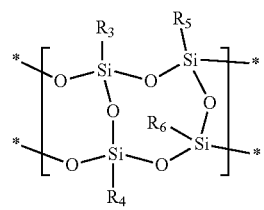

<Formula B>

-continued

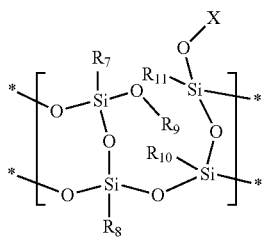
<Formula C> wherein in Formulae A to C,

* indicates a binding site to a neighboring atom, wherein in Formulae 3 to 7 and A to C, X and X' are each independently $R_{12}$ or $(SiO_{3/2}R)_{4+2n}$, n is an integer from 1 to 20, R, $R_3$, $R_4$, $R_7$, $R_8$, $R_{12}$, and $R_{29}$ to $R_{46}$ are each independently hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, $R_1$ and $R_2$ are each independently a halogen or a nitro group, $R_5$ and $R_6$ are each independently hydrogen, deuterium, an amine group, an epoxy group, a cyclohexylepoxy group, an acryl group, a methacryl group, a thiol group, an isocyanate group, a nitrile group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, and $R_9$ to $R_{11}$ are each independently hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{10}$ heterocycloalkyl group, or a substituted or unsubstituted $C_1$-$C_{60}$ heteroaryl group.

2. The light-emitting device of claim 1, wherein the composition further includes a siloxane resin.

3. The light-emitting device of claim 1, wherein the composition further includes a cross-linked resin.

4. The light-emitting device of claim 1, wherein the composition further includes a silane coupling agent.

5. The light-emitting device of claim 1, wherein the composition further includes polymethylvinyl siloxane, poly(methylphenyl)siloxane, poly(phenylvinyl)-co-(methylvinyl)silsesquioxane, or any combination thereof.

6. The light-emitting device of claim 1, wherein the composition further includes phenylhydrosilsesquioxane, dimethylsilylphenylether, or any combination thereof.

7. The light-emitting device of claim 1, wherein the composition further includes a sulfide-based silane compound, a mercapto-based silane compound, a vinyl-based silane compound, an amino-based silane compound, a glycidoxy-based silane compound, a nitro-based silane compound, a chloro-based silane compound, a methacryl-based silane compound, or any combination thereof.

8. The light-emitting device of claim 1, wherein the composition further includes a siloxane resin, a cross-linked resin, and a silane coupling agent, and based on the total composition, the composition includes:

an amount of the oligomeric compound in a range of about 1 weight % to about 20 weight %;

an amount of the siloxane resin in a range of about 30 weight % to about 85 weight %;

an amount of the cross-linked resin in a range of about 5 weight % to about 50 weight %; and an amount of the silane coupling agent in a range of about 0.05 weight % to about 10 weight %.

9. The light-emitting device of claim 1, wherein the planarization layer is prepared by curing the composition, and a curing temperature of the composition is in a range of about 150° C. to about 200° C.

10. The light-emitting device of claim 1, wherein the composition does not include a solvent.

11. The light-emitting device of claim 1, wherein the composition further includes a radical scavenger.

12. A light-emitting device comprising:

a first electrode;

a second electrode facing the first electrode;

a subminiature light-emitting device disposed between the first electrode and the second electrode; and a planarization layer disposed between the first electrode and the second electrode, wherein the subminiature light-emitting device has a length in a range of about 0.1 μm to about 10 μm, and the planarization layer comprises a composition including:

an oligomeric compound that includes:
a group represented by Formula A;
a group represented by Formula C; and
optionally, a group represented by Formula B; and a radical scavenger that is Compound 300:

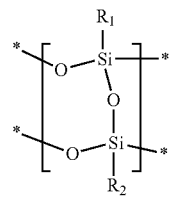
<Formula A>

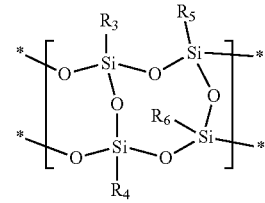
<Formula B>

-continued

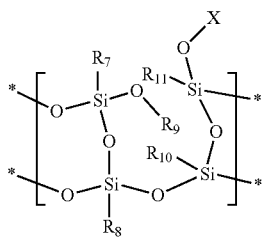
<Formula C> wherein in Formulae A to C,

X is $R_{12}$ or $(SiO_{3/2}R)_{4+2n}$, $R$, $R_3$, $R_4$, $R_7$, $R_8$, and $R_{12}$ are each independently hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, $R_1$ and $R_2$ are each independently a halogen or a nitro group, $R_5$ and $R_6$ are each independently hydrogen, deuterium, an amine group, an epoxy group, a cyclohexylepoxy group, an acryl group, a methacryl group, a thiol group, an isocyanate group, a nitrile group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted $C_7$-$C_{12}$ aralkyl group, a substituted or unsubstituted $C_6$-$C_{60}$ aryloxy group, or a substituted or unsubstituted $C_6$-$C_{60}$ arylthio group, $R_9$ to $R_{11}$ are each independently hydrogen, deuterium, halogen, an amine group, an epoxy group, a cyclohexylepoxy group, an acryl group, a methacryl group, a thiol group, an isocyanate group, a nitrile group, a nitro group, a substituted or unsubstituted $C_1$-$C_{10}$ heterocycloalkyl group, or a substituted or unsubstituted $C_1$-$C_{60}$ heteroaryl group, n is an integer from 1 to 20, and

* indicates a binding site to a neighboring atom, Compound 300

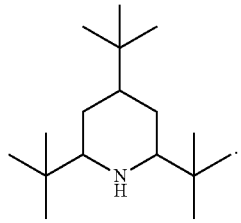 [SMILES: CC(C)(C)C1CC(C(C)(C)C)NC(C(C)(C)C)C1]

13. The light-emitting device of claim 12, wherein the composition further includes a siloxane resin.

14. The light-emitting device of claim 12, wherein the composition further includes a cross-linked resin.

15. The light-emitting device of claim 12, wherein the composition further includes a silane coupling agent.

16. The light-emitting device of claim 12, wherein the composition further includes polymethylvinyl siloxane, poly(methylphenyl)siloxane, poly(phenylvinyl)-co-(methylvinyl)silsesquioxane, or any combination thereof.

17. The light-emitting device of claim 12, wherein the composition further includes phenylhydrosilsesquioxane, dimethylsilylphenylether, or any combination thereof.

18. The light-emitting device of claim 12, wherein the composition further includes a sulfide-based silane compound, a mercapto-based silane compound, a vinyl-based silane compound, an amino-based silane compound, a glycidoxy-based silane compound, a nitro-based silane compound, a chloro-based silane compound, a methacryl-based silane compound, or any combination thereof.

19. The light-emitting device of claim 12, wherein
the composition further includes a siloxane resin, a cross-linked resin, and a silane coupling agent, and
based on the total composition, the composition includes:
an amount of the oligomeric compound in a range of about 1 weight % to about 20 weight %;
an amount of the siloxane resin in a range of about 30 weight % to about 85 weight %;
an amount of the cross-linked resin in a range of about 5 weight % to about 50 weight %; and
an amount of the silane coupling agent in a range of about 0.05 weight % to about 10 weight %.

20. The light-emitting device of claim 12, wherein
the planarization layer is prepared by curing the composition, and
a curing temperature of the composition is in a range of about 150° C. to about 200° C.

* * * * *